United States Patent
Chen et al.

(10) Patent No.: US 8,294,174 B2
(45) Date of Patent: Oct. 23, 2012

(54) LIGHT-EMITTING DEVICE

(75) Inventors: Chao-Hsing Chen, Hsinchu (TW); Yu-Pin Hsu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 294 days.

(21) Appl. No.: 12/870,407

(22) Filed: Aug. 27, 2010

(65) Prior Publication Data

US 2011/0062891 A1    Mar. 17, 2011

Related U.S. Application Data

(60) Provisional application No. 61/241,605, filed on Sep. 11, 2009.

(51) Int. Cl.
| | |
|---|---|
| *H01L 33/00* | (2010.01) |
| *H01L 29/417* | (2006.01) |
| *H01L 29/86* | (2006.01) |
| *H01L 29/861* | (2006.01) |

(52) U.S. Cl. ... 257/99; 257/109; 257/146; 257/E33.051; 257/E33.066; 257/E29.113; 257/E29.325; 257/E29.327; 315/294; 363/126

(58) Field of Classification Search .......... 257/99, 257/109, 146, E33.051, E33.066, E29.113, 257/E29.325, E29.327; 315/294; 363/125, 363/126
See application file for complete search history.

(56) References Cited

U.S. PATENT DOCUMENTS

| | | | |
|---|---|---|---|
| 7,855,388 B2* | 12/2010 | Yen et al. | 257/79 |
| 2007/0131942 A1* | 6/2007 | Yen et al. | 257/79 |
| 2009/0096386 A1* | 4/2009 | Yeh et al. | 315/294 |
| 2010/0308347 A1* | 12/2010 | Yeh et al. | 257/88 |
| 2011/0059559 A1* | 3/2011 | Yen et al. | 438/28 |
| 2011/0074305 A1* | 3/2011 | Yeh et al. | 315/253 |

\* cited by examiner

*Primary Examiner* — Victor A Mandala
(74) *Attorney, Agent, or Firm* — Muncy, Geissler, Olds & Lowe, PLLC

(57) ABSTRACT

This disclosure discloses a light-emitting device comprising a substrate; and a plurality of rectifying units, comprising a first rectifying unit and a second rectifying unit, formed on the substrate for receiving and regulating an alternating current signal into a direct current signal. Each of the rectifying units comprises a contact layer and a schottky metal layer. The light-emitting device further comprises a plurality of light-emitting diodes receiving the direct current signal; and a first terminal provided on the substrate and covering the contact layer of the first rectifying unit and the schottky metal layer of the second rectifying unit.

12 Claims, 5 Drawing Sheets

LIGHT-EMITTING DEVICE

This application claims the benefit of provisional application No. 61/241,605 filed on Sep. 11, 2009; the contents of which are incorporated herein by reference in their entirety

BACKGROUND

1. Technical Field

The present disclosure relates to a light-emitting device.

2. Description of the Related Art

The light-emitting diodes (LEDs) of the solid-state lighting elements have the characteristics of the low power consumption, low heat generation, long operational life, shockproof, small volume, quick response and good opto-electrical property like light emission with a stable wavelength, so the LEDs have been widely used in household appliances, indicator light of instruments, and opto-electrical products, etc. As the opto-electrical technology develops, the solid-state lighting elements have great progress in the light efficiency, operation life and the brightness, and LEDs are expected to become the main stream of the lighting devices in the near future.

Generally speaking, the conventional LED is driven by direct current (DC). An AC-DC inverter is required to invert DC to AC. Since the inverter has a large volume and heavy weight, the cost is added and the power is loss during inverting. It is difficult for LED to compete with the existing light source mainly because of the price concern. Therefore, there is a need for development of an AC-operated LED device without the AC/DC inverter.

SUMMARY OF THE DISCLOSURE

The present disclosure provides a light-emitting device.

The light-emitting device comprises a substrate; and a plurality of rectifying units, comprising a first rectifying unit and a second rectifying unit, formed on the substrate for receiving and regulating an alternating current signal into a direct current signal. Each of the rectifying units comprises a contact layer and a schottky metal layer. The light-emitting device further comprises a plurality of light-emitting diodes receiving the direct current signal; and a first terminal provided on the substrate and covering the contact layer of the first rectifying unit and the schottky metal layer of the second rectifying unit.

BRIEF DESCRIPTION OF THE DRAWINGS

The accompanying drawings are included to provide easy understanding of the application, and are incorporated herein and constitute a part of this specification. The drawings illustrate the embodiment of the application and, together with the description, serve to illustrate the principles of the application.

DETAILED DESCRIPTION OF THE EMBODIMENTS

The following shows the description of the embodiments of the present disclosure in accordance with the drawings.

Figure 1:
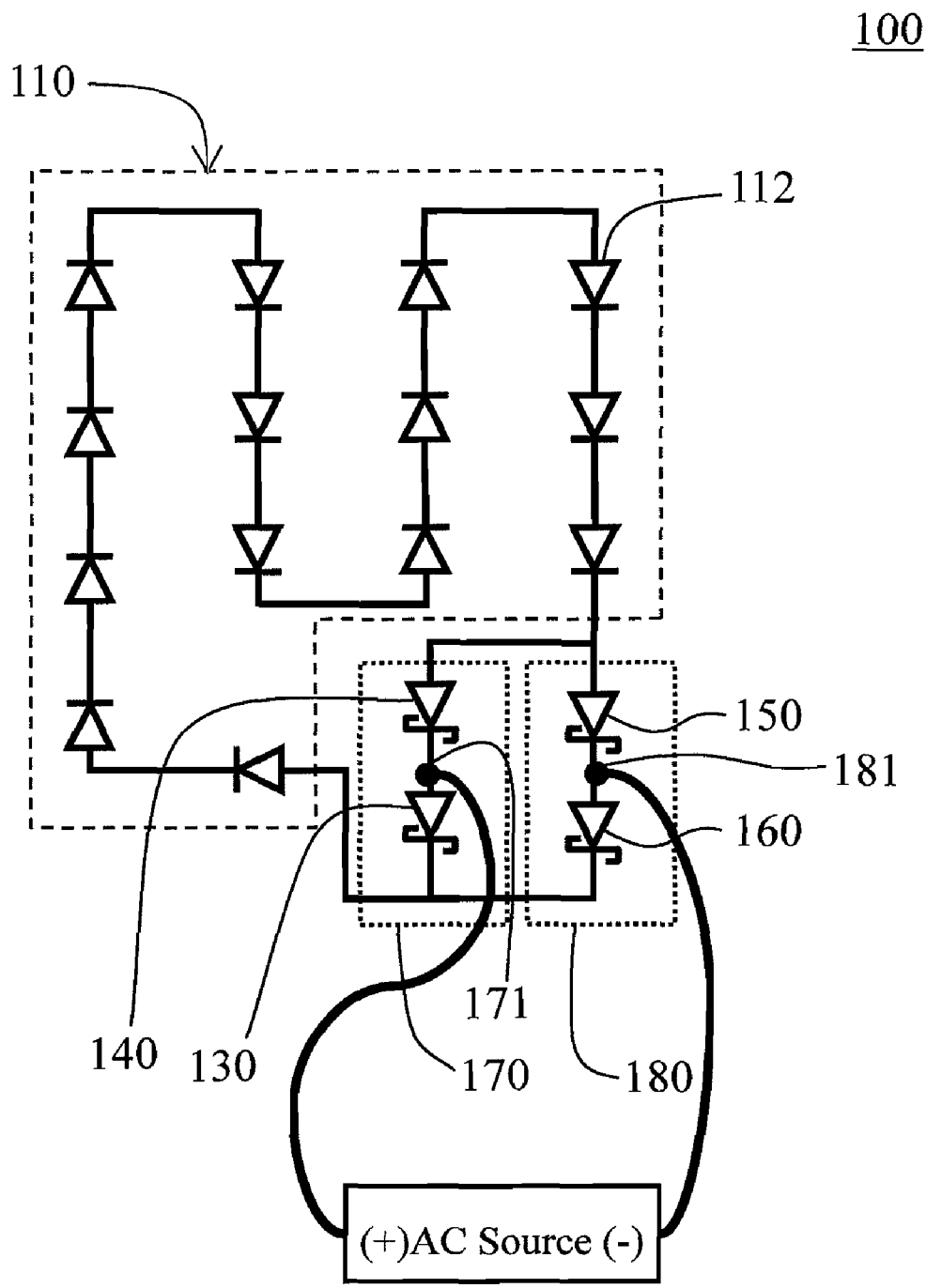
FIG. 1 shows a circuit diagram of a light-emitting device in accordance with one embodiment of the present disclosure.

FIG. 1 shows a circuit diagram of a light-emitting device 100 in accordance with one embodiment of the present disclosure. The light-emitting device 100 comprises a plurality of light-emitting diodes (LEDs) 112 connected in series to form a light-emitting group 110, a first, second, third and fourth rectifying units 130, 140, 150, 160 which are connected with the light-emitting group 110 in a full wave bridge rectifier configuration, e.g. Wheatstone bridge configuration, and a first terminal 171 and a second terminal 181 coupled between first and second rectifying units 130, 140, and between third and fourth rectifying units 150, 160, correspondingly. In the positive cycle of the alternating current (AC) power source, a current from the anode (+) of the AC power source is supplied to the light-emitting device 100, and flows from the first terminal 171, through the first rectifying unit 130, the light-emitting group 110, and the third rectifying unit 150, to the second terminal 181 and the cathode (−) of the AC power source. On the contrary, in the negative cycle of the AC power source, a current from the cathode (−) of the AC power source is supplied to the light-emitting device 100, and flows from the second terminal 181, through the fourth rectifying unit 160, the light-emitting group 110, and the second rectifying unit 140, to the first terminal 171 and the anode (+) of the AC power source.

Figure 2:
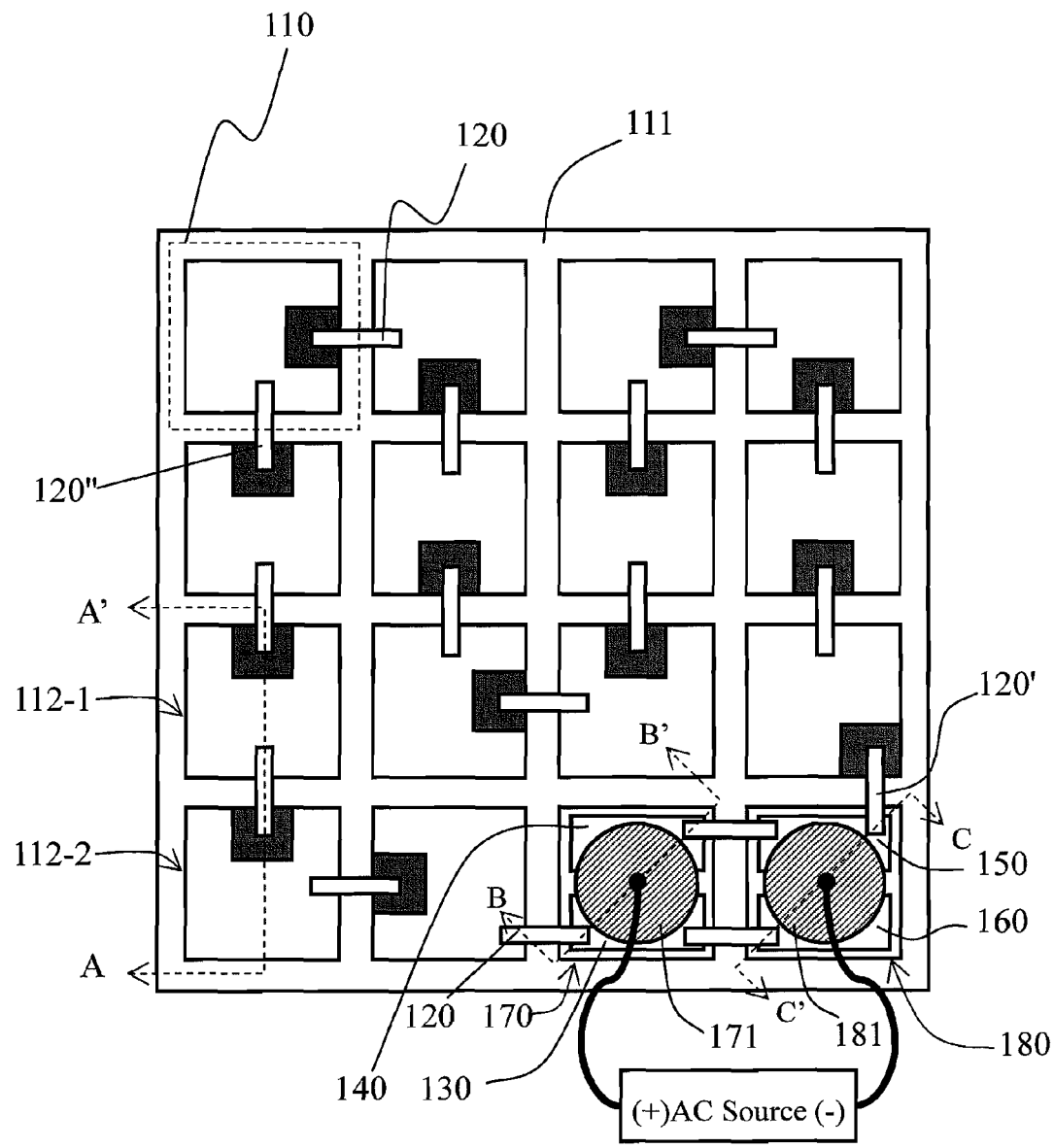
FIG. 2 shows a top view of the light-emitting device in accordance with one embodiment of the present disclosure.

FIG. 2 shows one embodiment of a top view of the light-emitting device 100 in accordance with the circuit diagram described in FIG. 1. The light-emitting device 100 comprises a common substrate 111 for supporting the plurality of light-emitting diodes 112 and the four rectifying units 130, 140, 150, 160. The common substrate 111 can be a growth substrate or a bonding substrate on which the light-emitting diodes 112 are grown or bonded. The common substrate 111 comprises at least one material selected from sapphire, SiC, GaN, AlN, GaP, GaAs, ZnO and Si. The light-emitting diodes 112 preferably comprise GaN based material or GaP based material. The plurality of the light-emitting diodes 112 and/or the rectifying units 130, 140, 150, 160 are commonly grown or bonded on the common substrate 111. The light-emitting diodes 112 are electrically connected to each other in series. The rectifying units 130, 140, 150, 160 are connected with the light-emitting group 110 through first and second interconnecting layers 120, 120' to form a full wave bridge rectifier configuration, e.g. the Wheatstone bridge configuration. The rectifying units 130, 140, 150, 160 mainly rectify the AC signal from the AC power source to a DC (direct current) signal, and then supply the DC signal to the light-emitting group 110. Therefore, the light-emitting group 110 is able to emit light during the positive and negative cycles of the AC signal. Each of the rectifying units 130, 140, 150, 160 is preferably with high breakdown voltage to prevent itself from being broken down while the device 100 is under reverse biased. Each of the rectifying units 130, 140, 150, 160 is preferably a single schottky diode with low turn-on voltage and high breakdown voltage. The first terminal 171 is formed on or covers the first and second rectifying units 130, 140, and the second terminal 181 is formed on or covers the third and fourth rectifying units 150, 160. The first terminal 171 and the first and second rectifying units 130, 140 form a first rectifying structure 170 electrically connecting to the anode of the AC power source. The second terminal 181 and the third and fourth rectifying units 150, 160 form a second rectifying structure 180 electrically connecting to the cathode of the AC power source. Each of the terminals 171, 181 shares the chip area occupied by the underlying rectifying units 130, 140, 150, 160 so that the chip area occupied by the terminals 171, 181 and the rectifying units 130, 140, 150, 160 can be minimized and more chip area can be used for the light emitting group 110. Consequently, the luminous efficiency of the light-emitting device 100 can be enhanced, and the cost of the light-emitting device 100 can be reduced. Each of the first and second terminals 171, 181 preferably acts as a bonding pad for wire bonding, and preferably comprises at least one material selected from Ni, Ti, Pt, Au, Cu, and Al.

Figure 3:
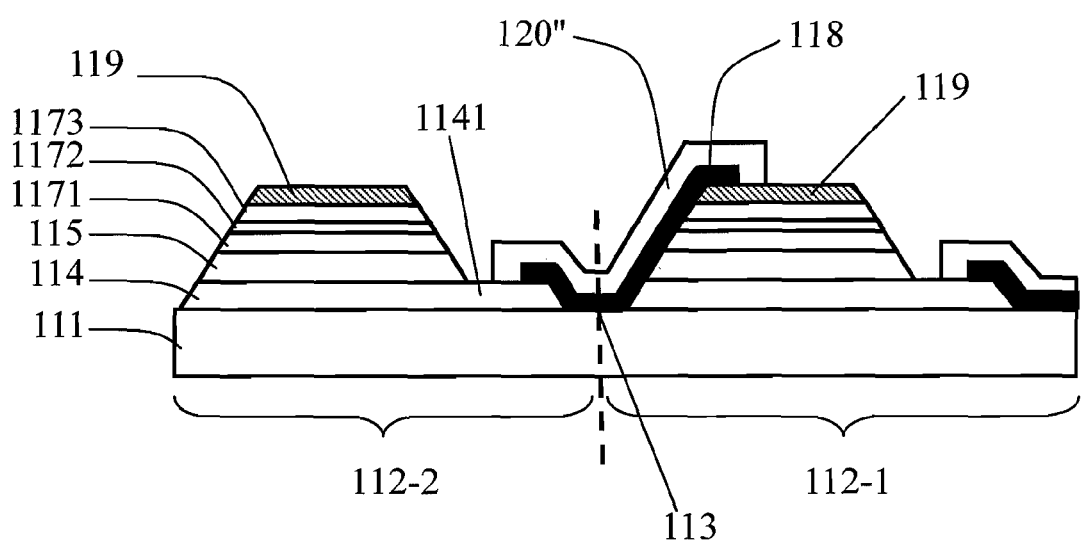
FIG. 3 shows a cross-sectional view of two light-emitting diodes of the light-emitting device, taken along line AA' of FIG. 2.

FIG. 3 shows a cross-section of two serially connected light-emitting diodes 112-1, 112-2 of the light-emitting group 110 as indicated in cross-section line AA' in FIG. 2. Each of the light-emitting diodes 112-1, 112-2 comprises an n-type semiconductor conductive layer 114 formed on the common substrate 111 and having an exposed portion 1141, an n-side contact layer 115 formed on and ohmically contacted with the n-type semiconductor conductive layer 114, an n-type semiconductor cladding layer 1171 formed on the n-side contact layer 115, an active layer 1172 formed on the n-type semiconductor cladding layer 1171, a p-type semiconductor cladding layer 1173 formed on the active layer 1172, and a p-side contact layer 119 formed on and ohmically contacted with the p-type semiconductor cladding layer 1173.

A trench 113 is formed between the two light-emitting diodes 112-1, 112-2 for physically separating the two light-emitting diodes 112-1, 112-2 upon the common substrate 111. A third interconnecting layer 120" electrically connects the p-side contact layer 119 of the light-emitting diode 112-1 and the exposed region 1141 of the n-type semiconductor conductive layer 114 of the adjacent light-emitting diode 112-2 for forming a serially connection between the two light-emitting diodes 112-1, 112-2. An insulating layer 118 is formed between the third interconnecting layer 120" and part of the light-emitting diodes 112-1, 112-2, and the trench 113 to prevent any unwanted short-circuit path. The n-side contact layer 115 preferably comprises a semiconductor material having a doping concentration level over $1*10^{18}$ cm$^{-3}$ to be able to form an ohmic contact with the n-type semiconductor conductive layer 114 and/or the n-type semiconductor cladding layer 1171. Similarly, the p-side contact layer 119 preferably comprises a semiconductor material having a doping concentration level over $1*10^{18}$ cm$^{-3}$ to be able to form an ohmic contact with the p-type semiconductor cladding layer 1173 and/or the third interconnecting layer 120". The first, second and third interconnecting layers 120, 120', 120" preferably comprise conductive materials like metal or transparent metal oxide.

Figure 4A:
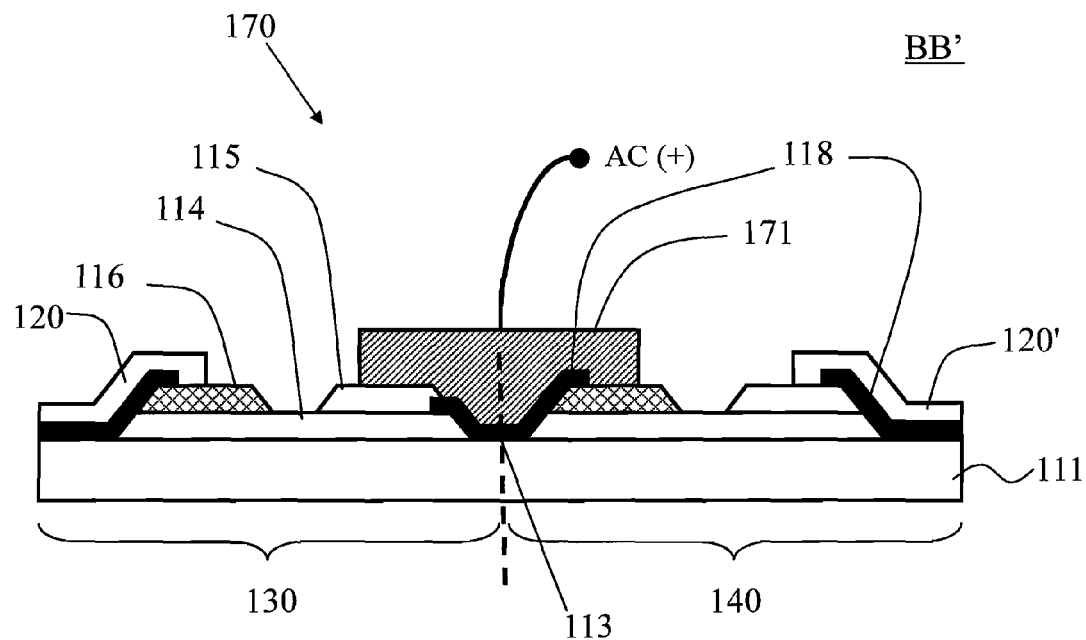
FIG. 4A shows a cross-sectional view of a first rectifying structure of the light-emitting device, taken along line BB' of FIG. 2.

FIG. 4A shows a cross-section of the first rectifying structure 170 as indicated in the cross-section line BB' in FIG. 2. The first rectifying structure 170 comprises the first and second rectifying units 130, 140, and the first terminal 171 on the first and second rectifying units 130, 140. The first and second interconnecting layers 120, 120' connect the first rectifying structure 170 to the light-emitting group 110 and the second rectifying structure 180. The first and second rectifying units 130, 140 each comprises an n-type semiconductor conductive layer 114 having an ohmic region and a schottky region, a schottky metal layer 116 formed on the schottky region of the n-type semiconductor conductive layer 114 for forming a schottky contact with the n-type semiconductor conductive layer 114, and an n-side contact layer 115 formed on the ohmic region of the n-type semiconductor conductive layer 114 for forming an ohmic contact with the n-type semiconductor conductive layer 114, wherein the n-side contact layer 115 of the first rectifying unit 130 neighbors the schottky metal layer 116 of the second rectifying unit 140. A trench 113 is formed between the first and second rectifying units 130, 140, for physically separating the first and second rectifying units 130, 140 upon the common substrate 111. The first rectifying structure 170 further comprises an insulating layer 118 covering portion of the side wall of the first and second rectifying units 130, 140, and the trench 113. Specifically, the insulating layer 118 covers a portion of the n-side contact layer 115 of the first rectifying unit 130, a portion of the schottky metal layer 116 of the second rectifying unit 140 and the trench 113 to prevent any unwanted short-circuit path between the first and second rectifying units 130, 140. The first terminal 171 is formed on or covers the n-side contact layer 115 of the first rectifying unit 130, the schottky metal layer 116 of the second rectifying unit 140 and the insulating layer 118. Electrical connections are therefore formed between the first terminal 171 and the n-side contact layer 115 of the first rectifying unit 130 and the schottky metal layer 116 of the second rectifying unit 140. The first interconnecting layer 120 electrically connects the schottky metal layer 116 of the first rectifying unit 130 to the light-emitting group 110 and the schottky metal layer 116 of the fourth rectifying unit 160 shown in FIG. 4B. The insulating layer 118 is further formed between the first interconnecting layer 120 and the first rectifying unit 130, and between the second interconnecting layer 120' and the second rectifying units 140. Specifically, the insulating layer 118 is formed between the first interconnecting layer 120 and the schottky region of the n-type semiconductor conductive layer 114 of the first rectifying unit 130 and between the second interconnecting layer 120' and the ohmic region of the n-type semiconductor conductive layer 114 of the second rectifying unit 140 to prevent any unwanted short-circuit path therebetween. The n-type semiconductor conductive layer 114 has a work function $\psi_S$, and the schottky metal layer 116 has a work function $\psi_M$ higher than $\psi_S$ such that a schottky contact is formed between the schottky metal layer 116 and the n-type semiconductor conductive layer 114. The schottky metal layer 116 comprises at least one material selected from Au, Ni, Pt, and Pd. The n-type semiconductor conductive layer 114 comprises gallium nitride or gallium phosphide intentionally or unintentionally doped with Si. The n-side contact layer 115 contains metal with a work function $\psi_N$ lower than $\psi_S$ or contains semiconductor material heavily doped with impurities having the same conductivity type as that of the n-type semiconductor conductive layer 114 and having a doping concentration no less than $5*10^{18}$ cm$^{-3}$.

Figure 4B:
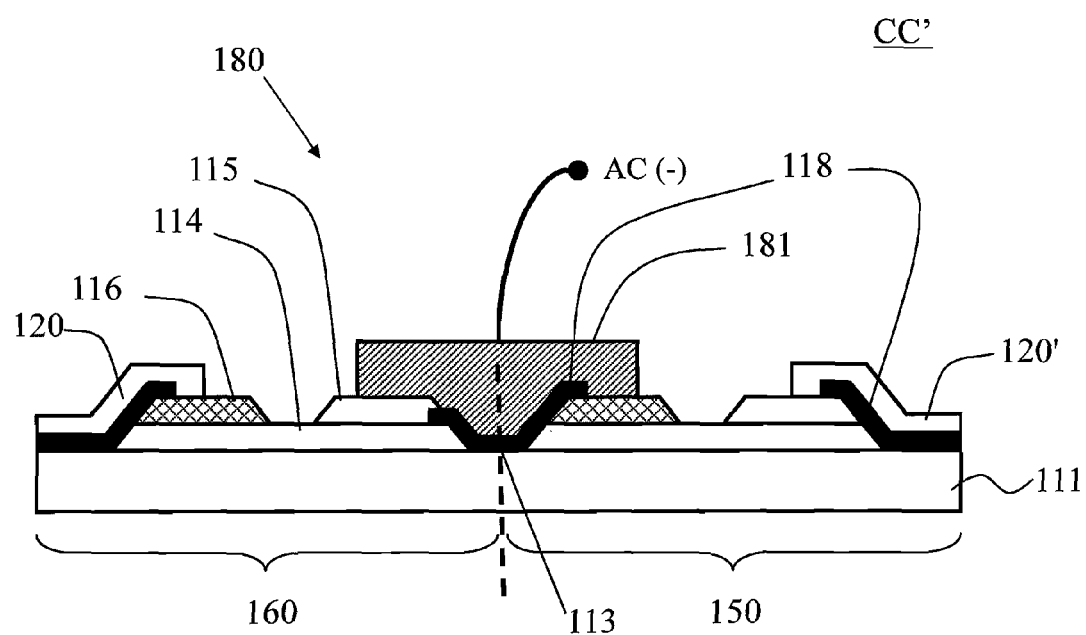
FIG. 4B shows a cross-sectional view of a second rectifying structure of the light-emitting device, taken along line CC' of FIG. 2.

FIG. 4B shows a cross-sectional structure of a second rectifying structure 180 as indicated in the cross-section line CC' in FIG. 2. The second rectifying structure 180 comprises the third and fourth rectifying units 150, 160, and the second terminal 181 on the third and fourth rectifying units 150, 160. The first and second interconnecting layer 120, 120' connect the second rectifying structure 180 to the light-emitting group 110 and the first rectifying structure 170. The third and fourth rectifying units 150, 160 each comprises an n-type semiconductor conductive layer 114 having an ohmic region and a schottky region on the common substrate 111, a schottky metal layer 116 formed on the schottky region of the n-type semiconductor conductive layer 114 for forming a schottky contact with the n-type semiconductor conductive layer 114, an n-side contact layer 115 formed on the ohmic region of the n-type semiconductor conductive layer 114 for forming an ohmic contact with the n-type semiconductor conductive layer 114, wherein the schottky metal layer 116 of the third rectifying unit 150 neighbors the n-side contact layer 115 of the fourth rectifying unit 160. A trench 113 is formed between the third and fourth rectifying units 150, 160 for physically separating the third and fourth rectifying units 150, 160 upon the common substrate 111. The second rectifying structure 180 further comprises an insulating layer 118 covering portion of the side wall of the rectifying units 150, 160 and the trench 113. Specifically, the insulating layer 118 covers a portion of the n-side contact layer 115 of the fourth rectifying unit 160, a portion of the schottky metal layer 116 of the third rectifying unit 150, and the trench 113 to prevent any unwanted short-circuit path between the third and fourth rectifying units 150, 160. The second terminal 181 is formed on or covers the schottky metal 116 of the third rectifying unit 150, the n-side contact layer 115 of the fourth rectifying unit 160 and the insulating layer 118. Electrical connections are therefore formed between the second terminal 181 and the n-side contact layer 115 of the fourth rectifying unit 160 and the schottky metal layer 116 of the third rectifying unit 150. The insulating layer 118 is further formed between the first interconnecting layer 120 and the fourth rectifying unit 160, and between the second interconnecting layer 120' and the third rectifying units 150. Specifically, the insulating layer 118 is formed between the first interconnecting layer 120 and the schottky region of the n-type semiconductor conductive layer 114 of the fourth rectifying unit 160, and between the second interconnecting layer 120' and the ohmic region of the n-type semiconductor conductive layer 114 of the third rectifying unit 150 to prevent any unwanted short-circuit path therebetween.

Figure 4C:
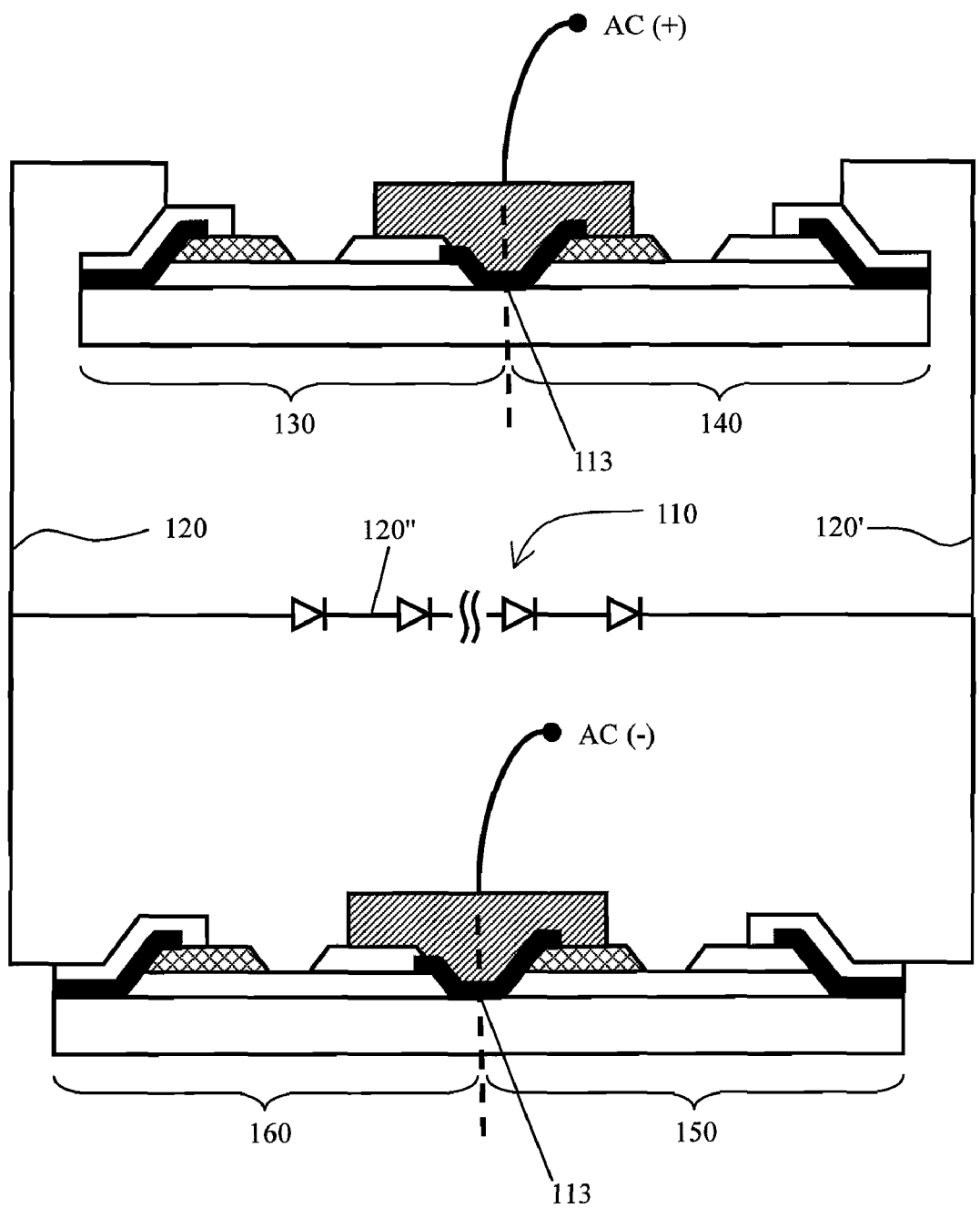
FIG. 4C shows a view of connection between the first and second rectifying units and a plurality of light-emitting diodes of the light-emitting device in accordance with one embodiment of the present disclosure.

The detailed connection between the first rectifying structure 170, the second rectifying structure 180 and the light-emitting group 110 can also be found in FIG. 4C. Specifically, the first interconnecting layer 120 electrically connects the schottky metal layer 116 of the fourth rectifying unit 160 to the schottky metal layer 116 of the first rectifying unit 130 and further to the light-emitting group 110; and the second interconnecting layer 120' electrically connects the n-side contact layer 115 of the second rectifying unit 140 to the n-side contact layer 115 of the third rectifying unit 150 and further to the light-emitting group 110 shown in FIG. 4C. In the positive cycle of the AC power source, due to a schottky barrier of the schottky region of the second rectifying unit 140, the current from the anode of the AC power source is applied to the first terminal 171, and flows through the ohmic region of the first rectifying unit 130, the light-emitting group 110, and the third rectifying unit 150 to the second terminal 181 and the cathode of the AC power source. Similarly, in the negative cycle of the AC power source, the current from the cathode of the AC power source is applied to the second terminal 181, and flows through the ohmic region of the fourth rectifying unit 160, the light-emitting group 110, and the second rectifying unit 140 to the first terminal 171 and the anode of the AC power source. By virtue of the arrangement of the first and second rectifying structures 170, 180, the chip area occupied by the rectifying units 130, 140, 150, 160 for performing a rectifying function can be minimized.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device comprising:
    a substrate;
    a plurality of rectifying units, comprising a first rectifying unit and a second rectifying unit, formed on the substrate for receiving and regulating an alternating current signal into a direct current signal, each of the rectifying units comprising a contact layer and a schottky metal layer;
    a plurality of light-emitting diodes receiving the direct current signal; and
    a first terminal provided on the substrate, and covering the contact layer of the first rectifying unit and the schottky metal layer of the second rectifying unit.

2. The light-emitting device of claim 1, further comprising a semiconductor conductive layer on the substrate, wherein the semiconductor conductive layer forms an ohmic region below the contact layer and a schottky region below the schottky metal layer in each of the rectifying unites.

3. The light-emitting device of claim 2, wherein the semiconductor conductive layer having a work function higher than that of the contact layer and lower than that of the schottky metal layer in each of the rectifying units.

4. The light-emitting device of claim 1, further comprising an insulating layer formed between the contact layer of the first rectifying unit and the schottky metal layer of the second rectifying unit.

5. The light-emitting device of claim 4, further comprising a trench formed between the first and the second rectifying units; wherein the trench is covered by the insulating layer.

6. The light-emitting device of claim 1, further comprising a second terminal; wherein the rectifying units further comprises a third rectifying unit and a fourth rectifying unit, wherein each of the rectifying units comprises a contact layer and a schottky metal layer, and wherein the second terminal covers the schottky metal layer of the third rectifying unit and the contact layer of the fourth rectifying unit.

7. The light-emitting device of claim 6, further comprising an insulating layer formed between the contact layer of the fourth rectifying unit and the schottky metal layer of the third rectifying unit.

8. The light-emitting device of claim 7, further comprising a trench formed between the third and the fourth rectifying units, and is covered by the insulating layer.

9. The light-emitting device of claim 6, further comprising a first interconnecting layer electrically connecting the schottky metal layers of the first and fourth rectifying units, and a second interconnecting layer electrically connecting the contact layers of the second and third rectifying units.

10. The light-emitting device of claim 9, further comprising an insulating layer formed between the first interconnecting layer and the first and the fourth rectifying units.

11. The light-emitting device of claim 6, further comprising a semiconductor conductive layer on the substrate, wherein the semiconductor conductive layer forms an ohmic region below the contact layer and a schottky region below the schottky metal layer in each of the rectifying unites.

12. The light-emitting device of claim 11, wherein the semiconductor conductive layer having a work function higher than that of the contact layer and lower than that of the schottky metal layer in each of the rectifying units.

* * * * *